United States Patent [19]

Tannas, Jr.

[11] 4,169,258

[45] Sep. 25, 1979

[54] ONE-THIRD SELECTION SCHEME FOR ADDRESSING A FERROELECTRIC MATRIX ARRANGEMENT

[75] Inventor: Lawrence E. Tannas, Jr., Orange, Calif.

[73] Assignee: Rockwell International Corporation, El Segundo, Calif.

[21] Appl. No.: 905,914

[22] Filed: May 15, 1978

Related U.S. Application Data

[63] Continuation of Ser. No. 678,501, Apr. 19, 1976, abandoned.

[51] Int. Cl.² ............................................. H04Q 9/00
[52] U.S. Cl. ........................... 340/166 FE; 340/166 R
[58] Field of Search ......... 340/166 FE, 174 M, 173.2, 340/324 M

[56] References Cited

U.S. PATENT DOCUMENTS

| | | | |
|---|---|---|---|
| 2,942,239 | 6/1960 | Eckert | 340/166 FE |
| 3,002,182 | 9/1961 | Anderson | 340/166 FE |
| 3,976,362 | 8/1976 | Kawakami | 340/166 FE |

Primary Examiner—Harold I. Pitts
Attorney, Agent, or Firm—H. Frederick Hamann; G. Donald Weber, Jr.

[57] ABSTRACT

An improved scheme for selectively addressing a matrix arrangement comprised of ferroelectrics having x and y orthogonally disposed intersecting lines. A one-third selection scheme is utilized that includes normalized selection signals having amplitudes: $V_x = 0$; $V_x = \frac{2}{3}$; $V_y = \frac{1}{3}$; and $V_y = 1$, which signals can be applied to the intersection of an x and y-line. The instant selection scheme minimizes both hysteresis creep and the cross-coupling voltage between x and y-lines to prevent undesirable hysteresis switching of the ferroelectric matrix arrangement.

11 Claims, 18 Drawing Figures

ONE-THIRD SELECTION SCHEME FOR ADDRESSING A FERROELECTRIC MATRIX ARRANGEMENT

The invention described herein was made in the performance of work under NASA Contract No. NAS1-12228 and is subject to the provisions of section 305 of the National Aeronautics and Space Act of 1958 (72 Stat. 435; 42 U.S.C. 2457).

CROSS REFERENCES TO RELATED APPLICATIONS

This patent application is a continuation of Ser. No. 678,501 filed Apr. 19, 1976, and now abandoned.

BACKGROUND OF THE INVENTION

1. Field of the Invention

This invention relates to an improved scheme for selectively addressing elements comprising a ferroelectric matrix arrangement, such as, but not limited to an information display memory.

2. Prior Art

A conventional method utilized to addess a ferroelectric matrix arrangement, such as that which forms a display memory comprised of x and y orthogonally disposed intersecting lines, is a one-half selection scheme. One example of a ferroelectric matrix arrangement, the ferroelectric elements of which are addressed by the prior art one-half selection scheme is found in U.S. Pat. No. 3,725,899 issued Apr. 3, 1973. To selectively enable a particular element in a matrix of elements to accept information (i.e. charge) supplied via an x-line, the intersecting y-line is addressed with a signal having full reference amplitude. To preserve the prior condition of all other elements of the memory, the associated intersecting y-lines are addressed with a signal having an amplitude corresponding to $\frac{1}{2}$ the reference level of full amplitude. Because of the electrical properties of a ferroelectric material, the $\frac{1}{2}$ reference signal level utilized in the conventional one-half selection scheme undesirably causes a relatively high depoling of the material from the normally poled remanant state. The poled state is diminished further with repeated $\frac{1}{2}$ reference signal pulses which occur during the process of addressing all the elements in the matrix. This repetitive depoling action is known as hysteresis creep to those skilled in the art.

Hysteresis creep adversely reduces the magnitude of polarization that is required to suitably distinguish between an "ON" and "OFF" element. Consequently, information stored by unselected elements can be altered or erased. That is, a large reduction in polarization can cause an unselected element that was driven to an ON condition to have the voltage characteristics of an element of display which is driven to zero polarization. Moreover, when the conventional one-half address selection scheme is employed, the resulting hysteresis creep prevents the use of ferroelectric materials in any memory array applications, inasmuch as the information contained by a ferroelectric memory element may be undesirably changed.

SUMMARY OF THE INVENTION

Briefly, and in general terms, a unique one-third selection scheme is disclosed to selectively address elements of a ferroelectric matrix arrangement comprising x and y orthogonally disposed intersecting lines. In a preferred embodiment, the ferroelectric matrix arrangement forms a display, a memory array, or the like. The instant one-third selection scheme includes normalized selection signals having amplitudes: $V_x=0$; $V_x=\frac{2}{3}$; $V_y=\frac{1}{3}$; and $V_y=1$, which signals can be applied to the intersection of an x and y-line. To selectively enable a particular element of the ferroelectric matrix to accept information supplied via an x-line, the relevant intersecting y-line is addressed with a normalized signal having full reference amplitude. To guard the present condition of all unselected elements of the matrix, the associated intersecting y-lines are addressed with a normalized signal having an amplitude corresponding to $\frac{1}{3}$ the reference level of full amplitude.

By virtue of the instant one-third selection scheme, hysteresis creep (which can occur as a result of the depoling of a typical ferroelectric material from the saturated remanant state) and cross-coupling voltages between x and y-lines are minimized. Thus, undesirable hysteresis switching of an element comprising the matrix arrangement is eliminated. That is, unselected elements of the matrix arrangement retain their information, inasmuch as excitation voltage variations (i.e. such as that which cause hysteresis creep) at the intersections of x and y-lines are substantially reduced.

DESCRIPTION OF THE PREFERRED EMBODIMENT

A conventional method utilized in addressing a matrix arrangement such as a ferroelectric memory comprising x and y-orthogonal lines, the intersections of which define memory elements, is a one-half selection scheme. That is, full voltage is applied to a particular y-line to enable it to accept input data that is supplied via the x-line or lines and thereby selectively switch an element of display according to the x-line data. One-half voltage is applied to all non-selected y-lines, which voltage is insufficient to cause a change in the prior state of the corresponding elements of display regardless of the data supplies via the x-line or lines.

Figure 1:
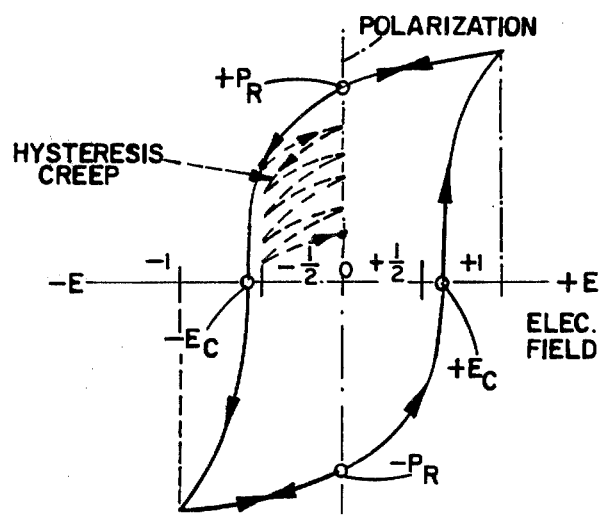
FIG. 1 is a typical hysteresis diagram for a ferroelectric material.

As is known by those skilled in the art, a high poling voltage is required to cause saturation of a ferroelectric material. A typical hysteresis diagram for ferroelectric materials is shown in FIG. 1. The one-half select voltage of a ferroelectric material is close to the switching voltage, $E_c$. Repetitive application of a $-\frac{1}{2}$ select voltage to a ferroelectric material has the effect of depoling the material from a normally poled state of $+P_R$ (the remanant polarization) so as to subsequently erase information stored at the intersection of unselected x and y lines. This depoling process is referred to in the art as hysteresis creep. The electrial path (shown dotted) representing the hysteresis creep of a typical ferroelectric material is illustrated in FIG. 1.

The selection voltage combinations that can occur at each intersection of orthogonal x and y-lines (which form an addressable ferroelectric memory) in a one-half selection scheme are shown in FIG. 2. The difference between the respective selection voltages, $V_x$ and $V_y$, of particular intersecting x and y-lines creates an electric field, E, across the ferroelectric material. The magnitude of the electric field is equivalent to the expression ($V_y - V_x$/thickness of the ferroelectric material). If the selection voltage signal causes an electric field greater than the switching voltage, $\pm E_c$, the previous polarization history is removed in one selection pulse. All of the x and y-lines are initially supplied with a signal having 0 pulse amplitude, thereby resulting in 0 initial electric field, designed $E_o$. The polarization at the intersections of each x and y-line is initially set to any suitable magnitude, e.g. $-P_R$ (designated OFF).

Figure 2A:
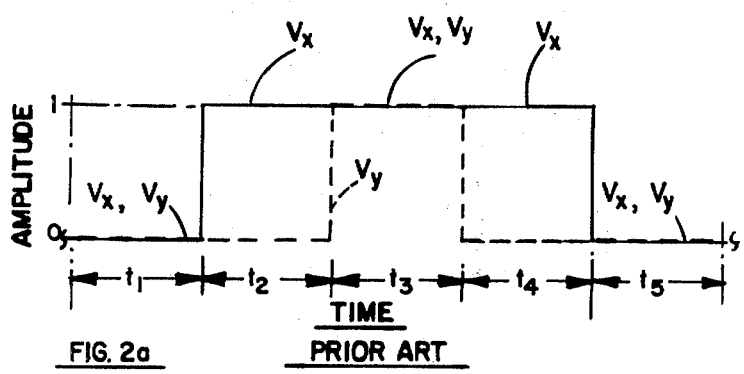
FIGS. 2(a) and (a)'-2(d) and (d)' show the four possible selection signal combinations and the corresponding hysteresis diagrams that can occur in a conventional one-half matrix addressing scheme.
Figure 2A:
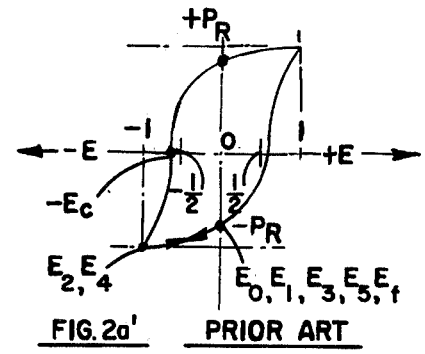

In operation, FIGS. 2(a) and (a)' show $V_x$ and $V_y$ pulse forms and respective hysteresis diagram employed in a conventional one-half selection scheme to unconditionally switch OFF a particular element comprising a matrix arrangement. During a time interval designated $t_1$, the amplitudes, $V_x$ and $V_y$, of both the x and y-line selection signals are a minimum pulse amplitude, designated 0. Thus, the magnitude of the electric field (i.e. $V_y - V_x$/thickness of the ferroelectric material) during the $t_1$ time interval, designated $E_1$ on the corresponding hysteresis diagram of FIG. 2(a)', is 0. During an interval of time designated $t_2$, the amplitude, $V_x$, of the x-line selection signal reaches maximum pulse amplitude, designated 1 (e.g. approximately 100 volts), while the amplitude, $V_y$, of the y-line selection signal remains 0. Thus, the magnitude of the resulting electric field, $E_2$, during the $t_2$ time interval, is $-1$ (e.g. approximately $-100$ volts/unit thickness). During an interval of time designated $t_3$, the amplitudes, $V_x$ and $V_y$, of each of the x and y-line selection signals reach maximum pulse amplitude (i.e. 1). Therefore, the magnitude of the resulting electric field, $E_3$, during the $t_3$ time interval, is again 0. During an interval of time designated $t_4$, the amplitude, $V_y$, of the y-line selection signal returns to 0 while the amplitude, $V_x$, of the x-line selection signal remains 1. The magnitude of the resulting electric field, $E_4$, during the $t_4$ time interval is $-1$. During an interval of time designated $t_5$ the amplitude, $V_x$, of the x-line selection signal returns to 0, while the amplitude, $V_y$, of the y-line selection signal remains 0. The magnitude of the electric field, $E_5$, during the $t_5$ time interval, is 0. The magnitude of the final electric field, designated $E_f$, remains 0 after the conclusion of the $t_5$ time interval. As illustrated by arrows in FIG. 2(a)', the magnitude of the electric field, $E_2$ and $E_4$, during the $t_2$ and $t_4$ time intervals exceeds the negative switching voltage, $-E_c$. Therefore, the particular element of the matrix arrangement is unconditionally switched OFF or remains OFF, if it were previously in an OFF condition.

Figure 2B:
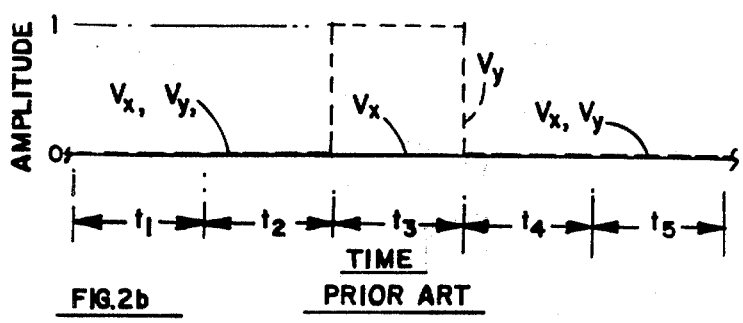
Figure 2B:
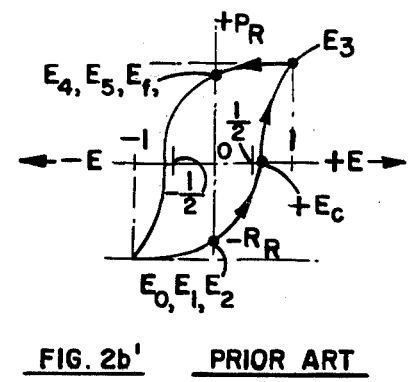

FIGS. 2(b) and (b)' show the $V_x$ and $V_y$ pulse forms and respective hysteresis diagram employed in a conventional one-half selection scheme to unconditionally switch ON a particular element comprising a matrix arrangement. During time intervals designated $t_1$ and $t_2$, the amplitudes, $V_x$ and $V_y$, of both the x and y-line selection signals are a minium pulse amplitude, designated 0. Thus, the magnitude of the electric field during the $t_1$ and $t_2$ time intervals, designated $E_1$ and $E_2$, respectively, on the corresponding hysteresis diagram of FIG. 2(b)' is 0. During an interval of time designated $t_3$, the amplitude, $V_y$, of the y-line selection signal reaches maximum pulse amplitude, 1, while the amplitude, $V_x$, of the x-line selection signal remains 0. The magnitude, $E_3$, of the resulting electric field during the $t_3$ time interval is 1. During the intervals of time designated $t_4$ and $t_5$, the amplitude, $V_y$, of the y-line selection signal returns to 0, while the amplitude, $V_x$, of the x-line selection signal remains 0. Therefore, the magnitude, $E_4$ and $E_5$, of each of the resulting electric fields during the $t_4$ and $t_5$ time intervals is 0. The magnitude of the final electric field, designated $E_f$, remains 0 after the conclusion of the $t_5$ time interval. As illustrated by arrows in FIG. 2(b)', the magnitude of the electric field, $E_3$, during the $t_3$ time interval sufficiently exceeds the switching voltage, $+E_c$, in order to drive the ferroelectric material into near saturation. (Full saturation is desirable but not achieved until $E_n \geq 3E_c$.) Therefore, the particular element of the matrix arrangement that is addressed by the x and y-line selection signals of FIG. 2(b) is unconditionally switched ON or remains ON, if it were previously in an ON conditon.

Figure 2C:
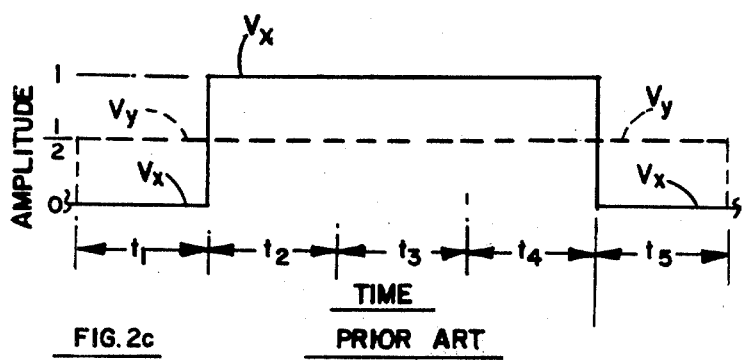
Figure 2C:
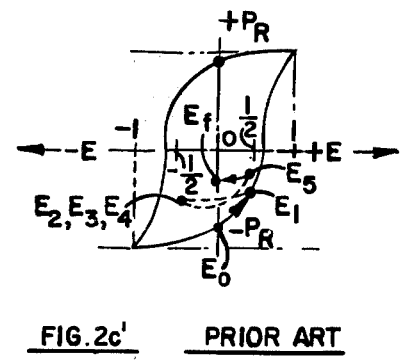

Referring to the pulse forms and respective hysteresis diagram of FIGS. 2(c) and (c)', the amplitude, $V_y$, of the y-line selection signal is maintained at a level equivalent to one half, designated ½ (e.g. approximately $+50$ volts), the maximum pulse amplitude, designated 1, throughout the entire time comprising intervals $t_1$-$t_5$. During an interval of time designated $t_1$, the amplitude, $V_x$, of the x-line selection signal is 0. Thus, the magnitude of the electric field during the $t_1$ time interval, designated $E_1$ on the corresponding hysteresis diagram, is ½. During the time intervals $t_2$, $t_3$ and $t_4$, the amplitude, $V_x$ of the x-line selection signal reaches maximum pulse amplitude, 1. The magnitude of each of the resulting electric fields, $E_2$, $E_3$ and $E_4$, during the $t_2$-$t_4$ time intervals is $-½$. During an interval of time designated $t_5$, the amplitude, $V_x$, of the x-line selection signal returns to 0. The magnitude of the resulting electric field, $E_5$, during the $t_5$ time interval, is again ½. After the conclusion of the $t_5$ time interval, the amplitudes, $V_x$ and $V_y$, of both the x and y-line selection signals return to 0. Thus, the magnitude, $E_f$, of the final electric field returns to 0 after completion of the $t_5$ time interval. Arrows indicate the direction (i.e. along the creep path, shown dotted) of the changing magnitude of the electric fields with respect to the loop of the hysteresis diagram of FIG. 2(c)' when the conventional one-half selection pulse forms of FIG. 2(c) are employed.

Figure 2D:
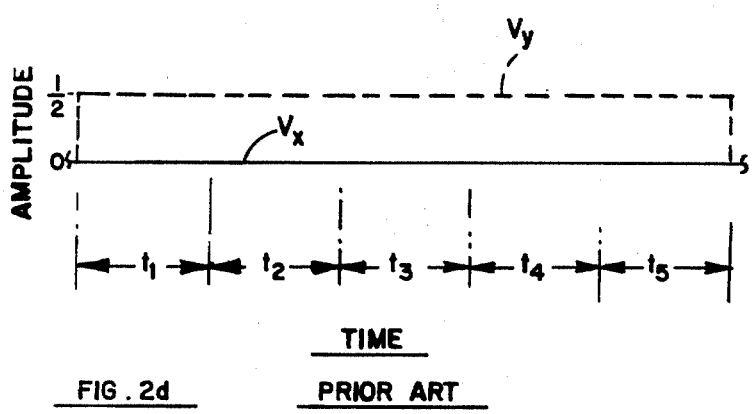
Figure 2D:
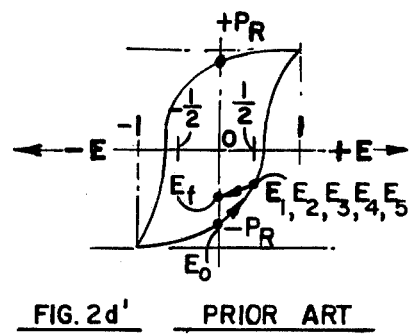

Referring to the $V_x$ and $V_y$ pulse forms and respective hysteresis diagram of FIGS. 2(d) and (d)', the amplitude, $V_x$, of the x-line selection signal remains 0, while the amplitude, $V_y$, of the y-line selection signal remains ½ for the duration of the times comprising intervals $t_1$-$t_5$. Therefore, the magnitude, $E_1$, $E_2$, $E_3$, $E_4$ and $E_5$, of each of the resulting electric fields during the $t_1$-$t_5$ time intervals is ½. After the conclusion of the $t_5$ time interval, the amplitude, $V_y$, of the y-line selection signal returns to 0, while the amplitude, $V_x$, of the x-line selection signal remains 0. As a result, the magnitude, $E_f$, of the final electric field is 0 after the $t_5$ time interval. Arrows indicate the direction (i.e. along the creep path, shown dotted) of the changing magnitude of the electric fields with respect to the loop of the hysteresis diagram of FIG. 2(d)' when the conventional one-half selection pulse forms of FIG. 2(d) are employed.

In each of the pulse forms of FIGS. 2(c) and (d), the amplitude, $V_y$, of the y-line selection signal is ½ the maximum pulse amplitude. As a result, undesirable creep occurs, the path of which moves off the loop of the respective hysteresis diagrams in each of FIGS. 2(c)' and (d)'. The creep paths reduce the magnitude of polarization in a direction toward 0. None of the magnitudes, $E_1$-$E_f$, of the resulting electric fields shown in FIGS. 2 (c)' and (d)' exceed the switching voltage, $\pm E_c$. Thus, the polarization of the elements of the matrix, which may be initially set at $-P_R$ (designated OFF), is reduced in magnitude. Similarly, it is also to be recognized that if the elements receiving the signals of FIG. 2(c) were initially poled at $+P_R$ (designated ON), not shown, the magnitude of polarization is also decreased. However, polarization of the elements of the matrix receiving the signals of FIG. 2(d) is not reduced in magnitude if the elements were initially set at $+P_R$, also not shown.

Hysteresis creep, such as that resulting from the conventional one-half selection scheme, substantially diminishes the polarization of the intersections of the x and y-lines unselected elements of the matrix to near zero polarization. Reduced polarization makes it difficult to distinguish between an ON or an OFF condition of the unselected elements.

In accordance with the instant invention, an improved method is disclosed to address a matrix arrangement of ferroelectric crystals comprising x and y-orthogonal lines, such as, but not limited to, a memory array. For example, such a memory is used to address an information display medium where charge stored by the memory elements is used to excite the display medium. The instant method includes a one-third selection scheme to reduce cross-coupling voltages between intersecting orthogonal lines and thereby reduce the amount of hysteresis creep which occurs when conventional selection scheme are utilized. Reduced cross-coupling voltage is accomplished by utilizing preselected, normalized selection signals having amplitudes: $V_x=0$; $V_x=\frac{2}{3}$; $V_y=\frac{1}{3}$; and $V_y=1$. All of the x and y-lines are initially supplied with a signal having 0 amplitude, thereby, resulting in 0 initial electric field, designated $F_o$. The selection voltage combinations that can occur at each intersection of an orthogonal x and y-line in the instant one-third selection scheme are shown in FIG. 3.

Figure 3A:
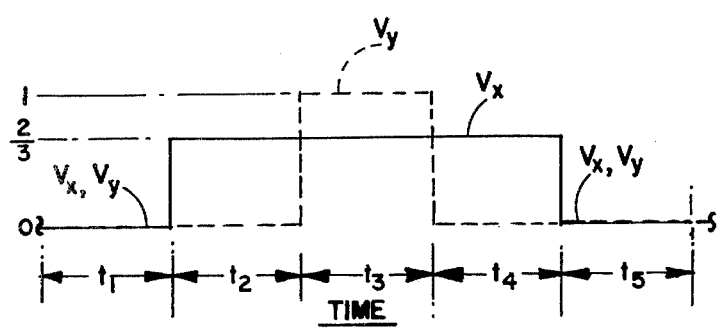
FIGS. 3(a) and (a)'-3(d) and (d)' show the four possible selection signal combinations and the corresponding hysteresis diagrams that can occur in the improved one-third matrix addressing scheme of the instant invention.
Figure 3A:
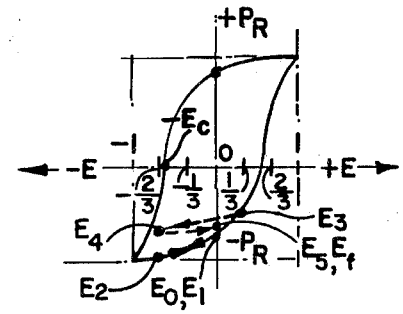

In operation, FIGS. 3(a) and (a)' show the $V_x$ and $V_y$ pulse forms and respective hysteresis diagram employed in the improved one-third selection scheme to cause a particular element comprising a matrix arrangement to remain OFF, if it is presently in an OFF condition. If the particular element is presently ON (e.g. $+P_r$), its level of polarization is diminished sufficiently to a negative polarization so as to correspond to an OFF condition. Unlike the conventional one-half selection scheme, the magnitude of polarization is initially set to $-P_R$ (OFF) with a negative pulse signal. During an interval of time designated $t_1$, the amplitudes, $V_x$ and $V_y$ of both the x and y-line selection signals are 0. Thus, the magnitude of the electric field (i.e. $V_y-V_x$/unit thickness) during the $t_1$ time interval, designated $E_1$ on the corresponding hysteresis diagram, is 0. During a time interval $t_2$, the amplitude, $V_x$, of the x-line selection signal switches to a level equivalent to two-thirds, designated $\frac{2}{3}$, the maximum pulse amplitude, designated 1. The amplitude, $V_y$, of the y-line selection signal remains 0. Therefore, the magnitude of the electic field, $E_2$, during the $t_2$ time interval is $-\frac{2}{3}$. During an interval of time designated $t_3$, the amplitude, $V_x$, of the x-line selection signal remains at $\frac{2}{3}$, while the amplitude, $V_y$, of the y-line selection signal switches to 1. The magnitude of the electric field, $E_3$, during the $t_3$ time interval is $\frac{1}{3}$. During a time interval designated $t_4$, the amplitude, $V_x$, of the x-line selection signal remains $\frac{2}{3}$, while the amplitude, $V_y$, of the y-line selection signal returns to 0. The magnitude of the electric field, $E_4$, during the $t_4$ time interval is again $-\frac{2}{3}$. During an interval of time designated $t_5$, the amplitude, $V_x$, of the x-line selection signal returns to 0, while the amplitude, $V_3$, of the y-line selection signal remains 0. Therefore, the magnitude of the electric field, $E_5$, during the $t_5$ time interval is 0. After the conclusion of the $t_5$ time interval, the amplitudes, $V_x$ and $V_y$, of both the x and y-line selection signals remains 0. The magnitude, $E_f$, of the final electric field remains 0 after completion of the $t_5$ time interval. Although the arrows of FIG. 3(a)' indicate an associated creeep path, shown dotted, the resulting small reduction in the magnitude of polarization of the selected element is relatively inconsequential.

Figure 3B:
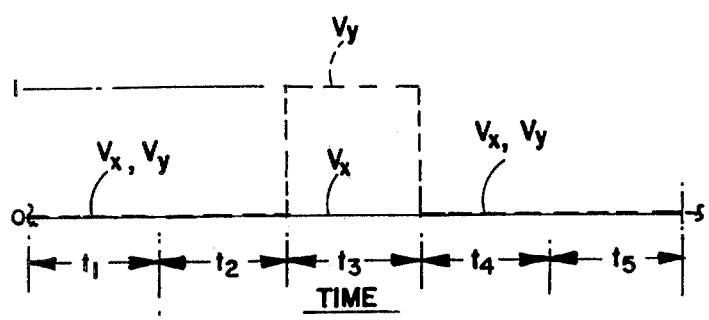
Figure 3B:
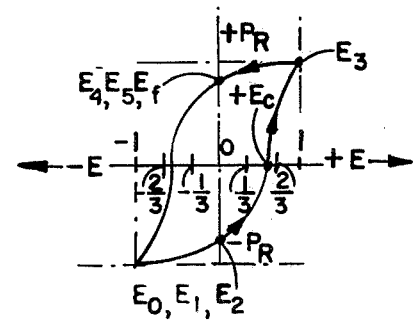

FIGS. 3(b) and(b)' show the $V_x$ and $V_y$ pulse forms and respective hysteresis diagram employed in the improved one-third selection scheme to unconditionally switch ON a particular element comprising a matrix arrangement. The pulse forms and respective hysteresis diagram of the instant one-third selection scheme are the same as the pulse forms and hysteresis diagram employed to unconditionally switch ON a particular element in the conventional one-half selection scheme, illustrated in FIGS. 2(b) and (b)'. Therefore, the method for unconditionally switching ON an element of display utilizing the improved one-third selection scheme is not disclosed again, but, reference may be made to the description of FIGS. 2(b) and (b)', supra.

Figure 3C:
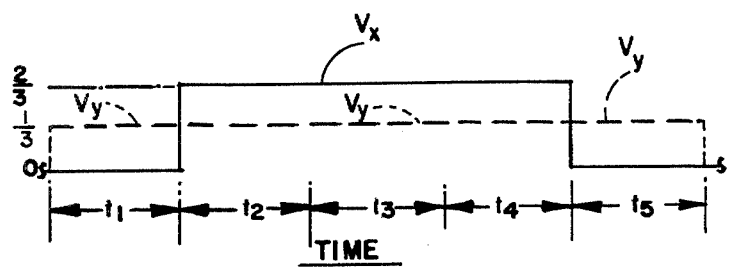
Figure 3C:
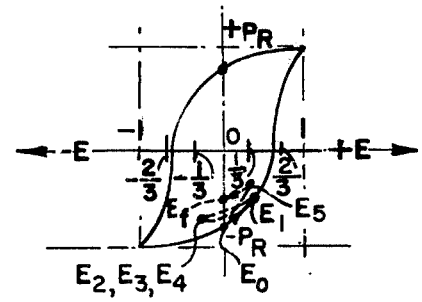

Referring to the pulse forms and respective hysteresis diagram of FIGS. 3(c) and (c)', the amplitude, $V_y$, of the y-line section signal is maintained at a level equivalent to one third, designated $\frac{1}{3}$, the maximum pulse amplitude, designated 1, throughout the entire time comprising intervals $t_1$-$t_5$. During an interval of time designated $t_1$, the amplitude, $V_x$, of the x-line selection is 0. Thus, the magnitude of the electric field during the $t_1$ time interval, designated $E_1$ on the corresponding hysteresis diagram, is 166 . During the time intervals $t_2$, $t_3$ and $t_4$, the amplitude, $V_x$, of the x-line selection signal reaches a pulse amplitude equivalent to two-thirds, designated $\frac{2}{3}$, the maximum pulse amplitude. The magnitude of each of the resulting electric fields, $E_2$, $E_3$, and $E_4$, during the $t_2$-$t_4$ time intervals is $-\frac{1}{3}$. During an interval of time designated $t_5$, the amplitude, $V_x$, of the x-line selection signal returns to 0. The magnitude of the resulting electric field, $E_5$, during the $t_5$ time interval, is again $\frac{1}{3}$. After the conclusion of the $t_5$ time interval, the amplitudes, $V_x$ and $V_y$, of both the x and y-line selection signals return to 0. Thus, the magnitude, $E_f$, of the final electric field returns to 0 after completion of the $t_5$ time interval. Arrows indicate the direction (i.e. along the creep path, shown dotted) of the changing magnitude of the electric fields with respect to the loop of the hysteresis diagram of FIG. 5(c)' when the improved one-third selection pulse forms of FIG. 3(c) are employed.

Figure 3D:
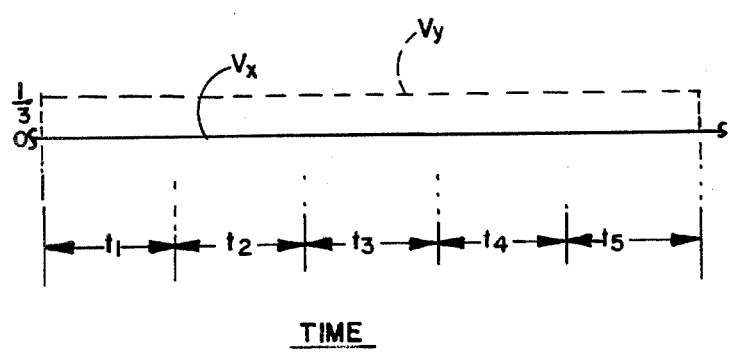
Figure 3D:
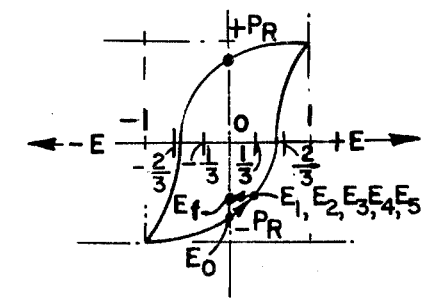

Referring to the $V_x$ and $V_y$ pulse forms and respective hysteresis diagram of FIGS. 3(d) and (d)', the amplitude, $V_x$, of the x-line selection signal remains 0, while the amplitude, $V_y$, of the y-line selection signal remains $\frac{1}{3}$ for the duration of the entire time comprising intervals $t_1$-$t_5$. Therefore, the magnitude, $E_1$, $E_2$, $E_3$, $E_4$ and $E_5$, of each of the resulting electric fields during the $t_1$-$t_5$ time interval is $\frac{1}{3}$. After the conclusion of the $t_5$ time interval, the amplitude, $V_y$, of the y-line selection signal returns to 0, while the amplitude, $V_x$, of the x-line selection signal remains 0. As a result, the magnitude, $E_f$, of the final electric field is 0 after the $t_5$ time interval. Arrows indicate the direction (i.e. along the creep path, shown dotted) of the changing magnitude of the electric field with respect to the loop of the hysteresis diagram of FIG. 3(d)' when the improved one-third selection pulse forms of FIG. 3(d) are employed.

None of the magnitudes, $E_1$-$E_f$, of the resulting electric fields illustrated in FIGS. 3(c)' and (d)' exceed the switching voltage, $\pm E_c$. Thus, those elements of ferroelectric display which are addressed by the x and y-line selection signals shown in either of FIGS. 3(c) and (d) are not switched ON or OFF, but retain their present condition. In each of the pulse forms of FIGS. 3(c) and (d), the amplitude, $V_y$, of the y-line selection signal is $\frac{1}{3}$ the maximum pulse amplitude, thereby resulting in hysteresis creep. However, each of the creep paths of FIGS. 3(c)' and (d)', which occurs in the instant one-third selection scheme, lies closer to the knee of the hysteresis loop than do the respective creep paths of the conventional one-half selection scheme. Thus, the creep paths which occur as a result of the instant one-third selection scheme reduce the magnitude of crystal polarization less than the creep paths in FIGS. 2(c)' and (d)'. Those elements of ferroelectric material which are addressed by the x and y-line selection signals shown in either of FIGS. 3(c) and (d) retain their present condition. Moreover, the selected elements are less susceptible to diminishing display voltage, as a consequence of a reduction in polarization, which is typically associated with the pulse forms, i.e. FIGS. 2(c) and (d), of the prior art one-half selection scheme. More particularly, as illustrated in FIGS. 3(c) and (d), the cross-coupling voltage signal levels (i.e. $V_y - V_x$) of the instant one-third selection scheme are less than the corresponding cross-coupling voltage signal levels of the conventional one-half selection scheme. Hysteresis creep is a function of the number of voltage pulses and the magnitude of the electric field relative to the switching voltage, $E_c$. A hysteresis diagram is non-linear, and a reduction of cross-coupling signals, achieved by virtue of the instant one-third selection scheme, is reflected by a corresponding geometric reduction of hysteresis creep.

Figure 4:
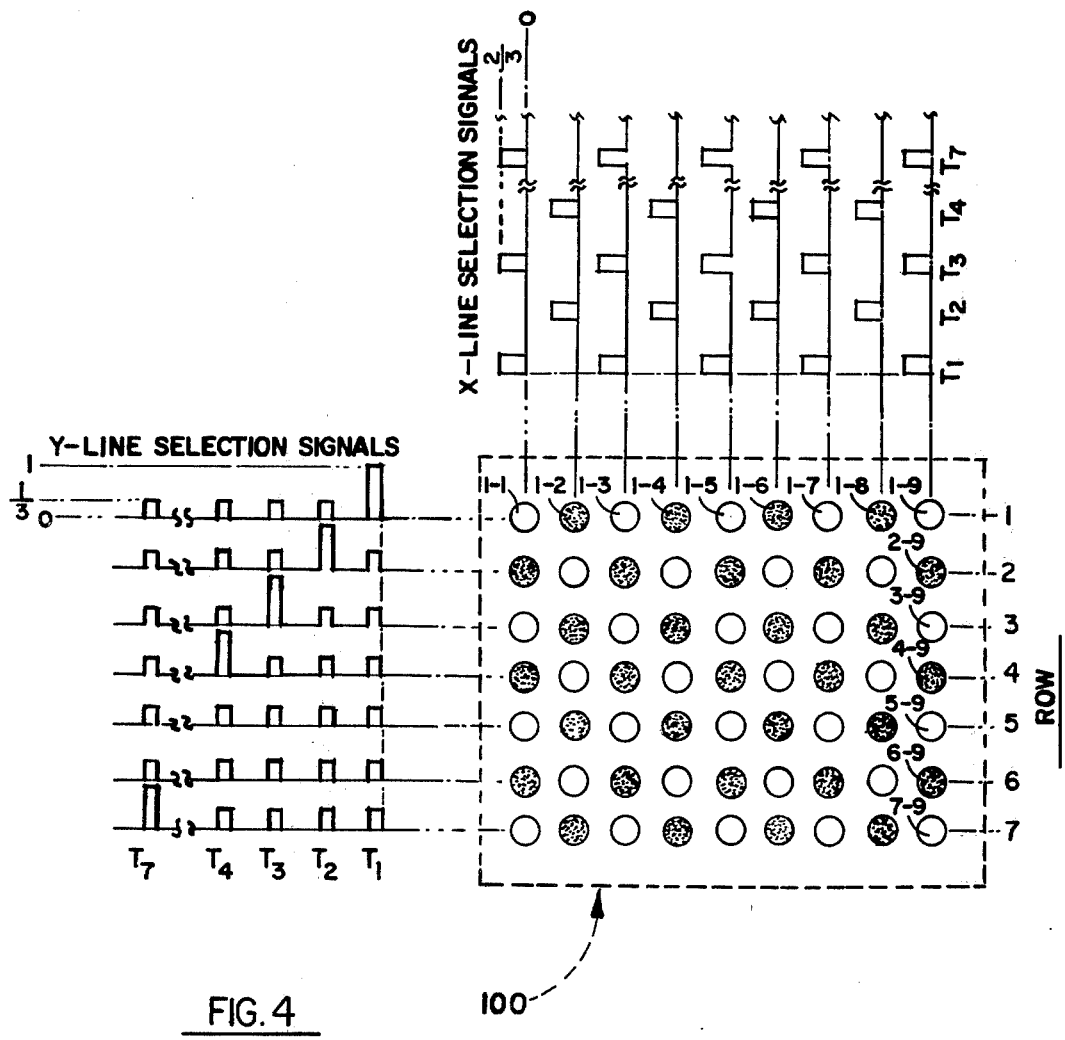
FIG. 4 shows the signal pulse forms of the instant one-third selection scheme applied to excite elements of an addressable ferroelectric matrix arrangement.

FIG. 4 shows the signals of the instant one-third selection scheme of FIG. 3 as they are applied to excite intersecting x and y-lines which define picture elements of an addressable ferroelectric matrix arrangement 100. In a preferred embodiment, the ferroelectric matrix arrangement 100 is an information display memory, but it is to be understood that the matrix arrangement may comprise other suitable arrays. The x and y-line selection signals of FIG. 4 are generated in a predetermined order and are applied to rows 1–7 of the matrix arrangement 100 by any suitable means, such as, for example, by the drivers disclosed in U.S. Pat. No. 3,952,212 issued Apr. 20, 1976. To improve performance, all the elements comprising matrix 100 are initially driven to an OFF condition by applying respective signals to the x and y-line or lines, so that the difference between signal levels ($V_y - V_x$) is a normalized $-1$.

In operation, one row of elements comprising matrix arrangement 100 is selectively addressed to receive information during each interval of selection time $T_1$-$T_n$. For example, during the $T_1$ selection time interval, the elements 1-1...1-9 comprising row 1 of matrix arrangement 100 are driven to either an OFF or ON condition by respective x and y-line selection signals of FIGS. 3(a) and (b). When the amplitude, $V_y$, of the normalized y-line selection signal reaches a maximum pulse amplitude, 1, an element of display is conditioned to be selectively switched OFF or ON depending upon the pulse amplitude, $V_x$, of the x-line selection signal. Matrix elements 1-1, 1-3, 1-5, 1-7 and 1-9 receive a normalized x-line selection signal, the amplitude of which is $\frac{2}{3}$ during the $T_1$ selection interval. Hence, as disclosed when referring to FIGS. 3(a) and (a)', these aforementioned elements are switched OFF. However, matrix elements 1-2, 1-4, 1-6 and 1-8 receive an x-line selection signal, the amplitude of which is 0 during the $T_1$ selection interval. Hence, as disclosed when referring to FIGS. 3(b) and (b)', these aforementioned elements are unconditionally switched ON (shown dotted). Thus, row 1 of matrix arrangement 100 is selectively driven to form a pattern of alternate OFF and ON elements.

While any one row 1–7 of matrix arrangement 100 is being selectively addressed to receive information, it is desirable to retain the information of each of the elements comprising the other rows. For example, during the $T_1$ selection time interval, each of the elements comprising rows 2–7 receive a normalized y-line selection signal, the amplitude of which is $\frac{1}{3}$. Hence, as disclosed when referring to FIGS. 3(c) and (d), those elements of the matrix arrangement 100 which are addressed by a y-line selection signal having an amplitude of $\frac{1}{3}$ are not driven to either an OFF or ON condition. The elements retain their present information without being adversely susceptible to diminishing voltage levels and hysteresis switching, as commonly occurs when utilizing a conventional (e.g. one-half) selection scheme. Moreover, hysteresis creep, which acts to undesirably reduce the magnitude of polarization applied to excite a medium (e.g. liquid crystal) comprising the information display, is minimized. The operation of the remaining rows 2–7 of elements comprising matrix arrangement 100 to either accept or guard information during the succeeding $T_2$-$T_7$ selection time intervals will be known to those skilled in the art.

It will be apparent that while a preferred embodiment of the invention has been shown and described, various modifications and changes may be made without departing from the true spirit and scope of the invention. Although a 7×9 ferroelectric matrix arrangement is illustrated in FIG. 4, this is for explanatory purposes only. Any suitably sized matrix arrangement 100 may be formed. Moreover, while the elements of the ferroelectric matrix arrangement 100 are selectively driven to make a pattern of consecutive rows 1–7 of alternating OFF and ON elements, it is to be understood that the elements may be addressed by the instant one-third selection scheme to make any other convenient pattern. What is more, the x and y-line need not be orthogonal and the line intersections or elements need not form a uniform array in location, size or shape. Those skilled in the art will recognize that the instant one-third selection scheme can be applied to selectively excite elements of a matrix comprised of either ferroelectrics, ferromagnetics, or the like material.

It is also to be understood that the selection signal pulse forms illustrated in FIGS. 3(a), (b), (c) and (d) show a preferred embodiment of the instant invention. Both the normalized signal levels, $V_x$ and $V_y$, applied to excite respective x and y-line or lines may be shifted either positively or negatively. However, the relative differences in magnitude (i.e. $V_y - V_x$) between the normalized signals are maintained at a level corresponding to those which are disclosed and recited in the following claims. Moreover, the respective differences between the two normalized x-line selection signals (e.g. 0 and ⅔) and between the two normalized y-line selection signals (e.g. ⅓ and 1) are maintained at a level corresponding to ⅓. Also, the length of one or each of the time intervals $t_1$, $t_2$, $t_4$ and $t_5$ may be decreased towards zero for the pulse forms illustrated in FIGS. 3(a) and (c). However, the leading and trailing edges of the $V_x$ and $V_y$ selection signals occur (relative to the $t_3$ time interval) in the sequence which is shown and described.

Having thus set forth a preferred embodiment of the instant invention, what is claimed is:

1. A method for selectively addressing particular memory elements having hysteresis and forming an array of memory elements and for guarding the condition of memory elements other than those particular elements being selectively addressed, wherein the selectively addressed elements from said array are excited to one of a relatively positive or negative condition, each of said elements of the array comprising the intersection of a respective x and a respective y-line, some of said x-lines driven with a particular normalized selection signal having an amplitude of either 0 or ⅔, and some of said y-lines driven with a particular normalized selection signal having an amplitude of either 0, ⅓ or 1, said method including the steps of:

at least one selectively addressed element of the array being turned off by exciting said element to the negative condition by driving the respective x-line thereof with a normalized selection signal having amplitude ⅔ and driving the respective y-line thereof with a normalized selection signal having amplitude 1, and at least one other selectively addressed element of the array being turned on by exciting said element to the positive condition by driving the respective x-line thereof with a normalized selection signal having amplitude 0 and driving the respective y-line thereof with a normalized selection signal having amplitude 1.

2. The method recited in claim 1, including selecting the elements comprising said array from a ferroelectric material.

3. The method recited in claim 1, including selecting the elements comprising said array from a ferromagnetic material.

4. The method recited in claim 1 including the further step of driving said x-line at an interval of time before driving said y-line for exciting the particular element of said array to the negative condition.

5. The method recited in claim 4, including the further step of terminating said x-line selection signal at an interval of time later than the terminating of said y-line selection signal.

6. The method recited in claim 1, including the further step of initially polarizing the particular element of said array to the negative remanant state.

7. The method recited in claim 1, wherein the condition of each of the elements of said array other than the particular elements being selectively addressed is guarded by the steps of:

driving said x-line with a normalized selection signal having amplitude ⅔; and driving said y-line with a normalized selection signal having amplitude ⅓.

8. The method recited in claim 7, including the further step of driving said x-line at an interval of time after the driving of said y-line for guarding the condition of said elements.

9. The method recited in claim 8, including the further step of terminating said x-line selection signal at an interval of time before the terminating of said y-line selection signal.

10. The method recited in claim 1, wherein the condition of each of the elements of said array other than the particular elements being selectively addressed is guarded by the steps of:

driving said x-line with a selection signal having amplitude 0; and driving said y-line with a normalized selection signal having amplitude ⅓.

11. The method recited in claim 1, said array forming an information display memory.

* * * * *

UNITED STATES PATENT AND TRADEMARK OFFICE
CERTIFICATE OF CORRECTION

PATENT NO. : 4,169,258
DATED : September 25, 1979
INVENTOR(S) : Lawrence E. Tannas It is certified that error appears in the above-identified patent and that said Letters Patent are hereby corrected as shown below:

Column 5, Line 42, change "$F_o$" to --$E_o$--.
Column 6, Line 9, change "$V_3$" to --$V_y$--.
          Line 17, change "creeep" to --creep--.
          Line 43, change "166" to --1/3--.
          Line 59, change "5" to --3--.
Column 9, Line 7, change "1/3" to --2/3--.

Signed and Sealed this

First Day of April 1980

[SEAL]

Attest:

SIDNEY A. DIAMOND

Attesting Officer     Commissioner of Patents and Trademarks